(12) United States Patent
Huang et al.

(10) Patent No.: US 9,111,982 B2
(45) Date of Patent: Aug. 18, 2015

(54) WAFER ASSEMBLY WITH CARRIER WAFER

(75) Inventors: I-Hsiung Huang, Hsinchu County (TW); Heng-Hsin Liu, New Taipei (TW); Heng-Jen Lee, Baoshan Township (TW); Chin-Hsiang Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 17 days.

(21) Appl. No.: 13/539,243

(22) Filed: Jun. 29, 2012

(65) Prior Publication Data

US 2013/0285264 A1 Oct. 31, 2013

Related U.S. Application Data

(60) Provisional application No. 61/638,209, filed on Apr. 25, 2012.

(51) Int. Cl.
*H01L 21/683* (2006.01)

(52) U.S. Cl.
CPC ..... *H01L 21/6835* (2013.01); *H01L 2221/6834* (2013.01); *H01L 2221/68381* (2013.01)

(58) Field of Classification Search
CPC ............... H01L 2221/68368; H01L 21/76251; H01L 23/544
USPC ........... 257/797; 438/401, 464, 406, 459, 544
See application file for complete search history.

(56) References Cited

U.S. PATENT DOCUMENTS

| | | | |
|---|---|---|---|
| 5,236,118 A | 8/1993 | Bower et al. | |
| 6,441,504 B1 * | 8/2002 | Glenn et al. | 257/797 |
| 8,324,006 B1 * | 12/2012 | Adler et al. | 438/50 |
| 2002/0094663 A1 | 7/2002 | Kwon et al. | |
| 2004/0096755 A1 * | 5/2004 | Koike et al. | 430/5 |
| 2004/0157408 A1 | 8/2004 | Best et al. | |
| 2008/0122041 A1 | 5/2008 | Kroener et al. | |
| 2009/0250823 A1 * | 10/2009 | Racz et al. | 257/778 |
| 2010/0078753 A1 * | 4/2010 | Mehregany et al. | 257/467 |
| 2011/0042729 A1 * | 2/2011 | Chen et al. | 257/288 |

FOREIGN PATENT DOCUMENTS

| | | |
|---|---|---|
| DE | 10029035 | 2/2002 |
| EP | 1278245 | 1/2003 |
| KR | 10-0401655 | 10/2003 |
| KR | 10-2004-0055696 | 6/2004 |
| KR | 10-2012-0027237 | 3/2012 |
| TW | 477465 | 2/2002 |
| TW | 200605258 | 2/2006 |
| WO | WO2011130586 | 10/2011 |

OTHER PUBLICATIONS

Office Action dated Nov. 28, 2012 from corresponding application No. De 10 2012 107 899.8.

(Continued)

*Primary Examiner* — Kyoung Lee
*Assistant Examiner* — Ratisha Mehta
(74) *Attorney, Agent, or Firm* — Lowe Hauptman & Ham, LLP

(57) ABSTRACT

A wafer assembly includes a process wafer and a carrier wafer. Integrated circuits are formed on the process wafer. The carrier wafer is bonded to the process wafer. The carrier wafer has at least one alignment mark.

20 Claims, 2 Drawing Sheets

(56) References Cited

OTHER PUBLICATIONS

Office Action dated Dec. 30, 2013 with English Translation from corresponding application No. KR10-2012-0127609.

Office Action dated Sep. 19, 2014 from corresponding No. TW 102110602.

* cited by examiner

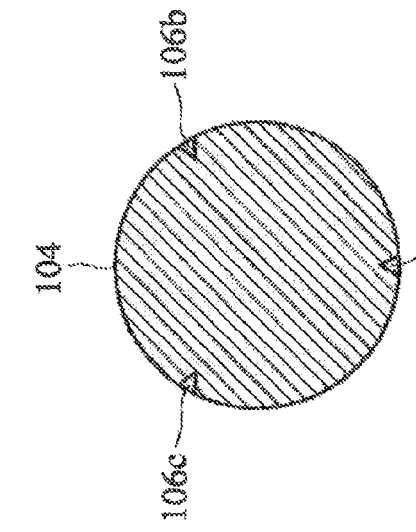
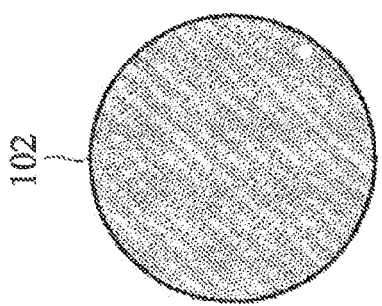
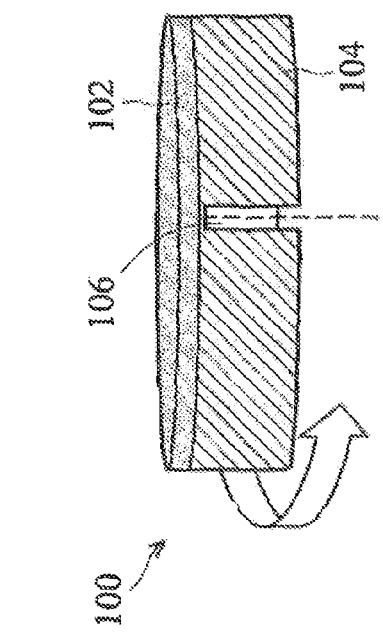
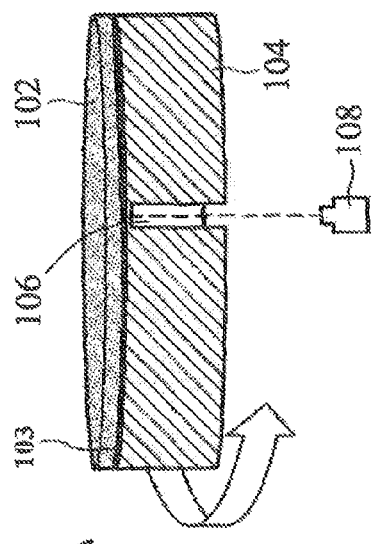
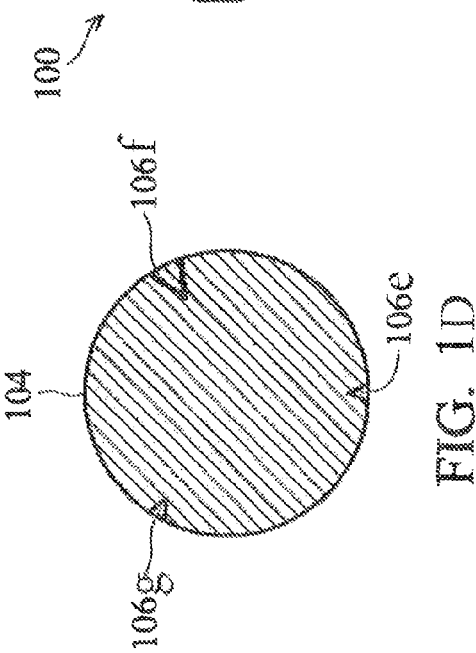

WAFER ASSEMBLY WITH CARRIER WAFER

CROSS-REFERENCE TO RELATED APPLICATION

The present application claims priority of U.S. Provisional Patent Application Ser. No. 61/638,209, filed on Apr. 25, 2012, which is incorporated herein by reference in its entirety.

TECHNICAL FIELD

The present disclosure relates generally to a semiconductor assembly and more particularly a wafer assembly with a carrier wafer.

BACKGROUND

As the size of a wafer increases, sagging caused by the weight of the wafer and wafer warpage from a film growth process are challenging issues. The wafer warpage occurs when growing various films on the surface of a wafer as part of the device fabrication process. In one example, a 450 mm wafer would need to have a thickness of 1,800 µm (1.8 mm) to maintain the same level of wafer sag as a 300 mm wafer with a thickness of 775 µm. In another example, a 450 mm wafer with a 100 nm nitride film grown or deposited thereon may need to have a thickness of at least 1,180 µm to confine the wafer warpage to a level roughly the same as that of a 300 mm wafer with a thickness of 775 µm.

BRIEF DESCRIPTION OF THE DRAWINGS

Reference is now made to the following descriptions taken in conjunction with the accompanying drawings, in which:

FIG. 1A is a schematic diagram of an exemplary wafer assembly with a carrier wafer according to some embodiments;

FIG. 1B is a top view of a process wafer of the wafer assembly in FIG. 1A according to some embodiments;

FIG. 1C is a top view of a carrier wafer of the wafer assembly in FIG. 1A according to some embodiments; and FIG. 1D is a top view of a carrier wafer of a wafer assembly according to some embodiments.

FIG. 1E is a schematic diagram of an exemplary wafer assembly according to some embodiments.

DETAILED DESCRIPTION

Figure 2:
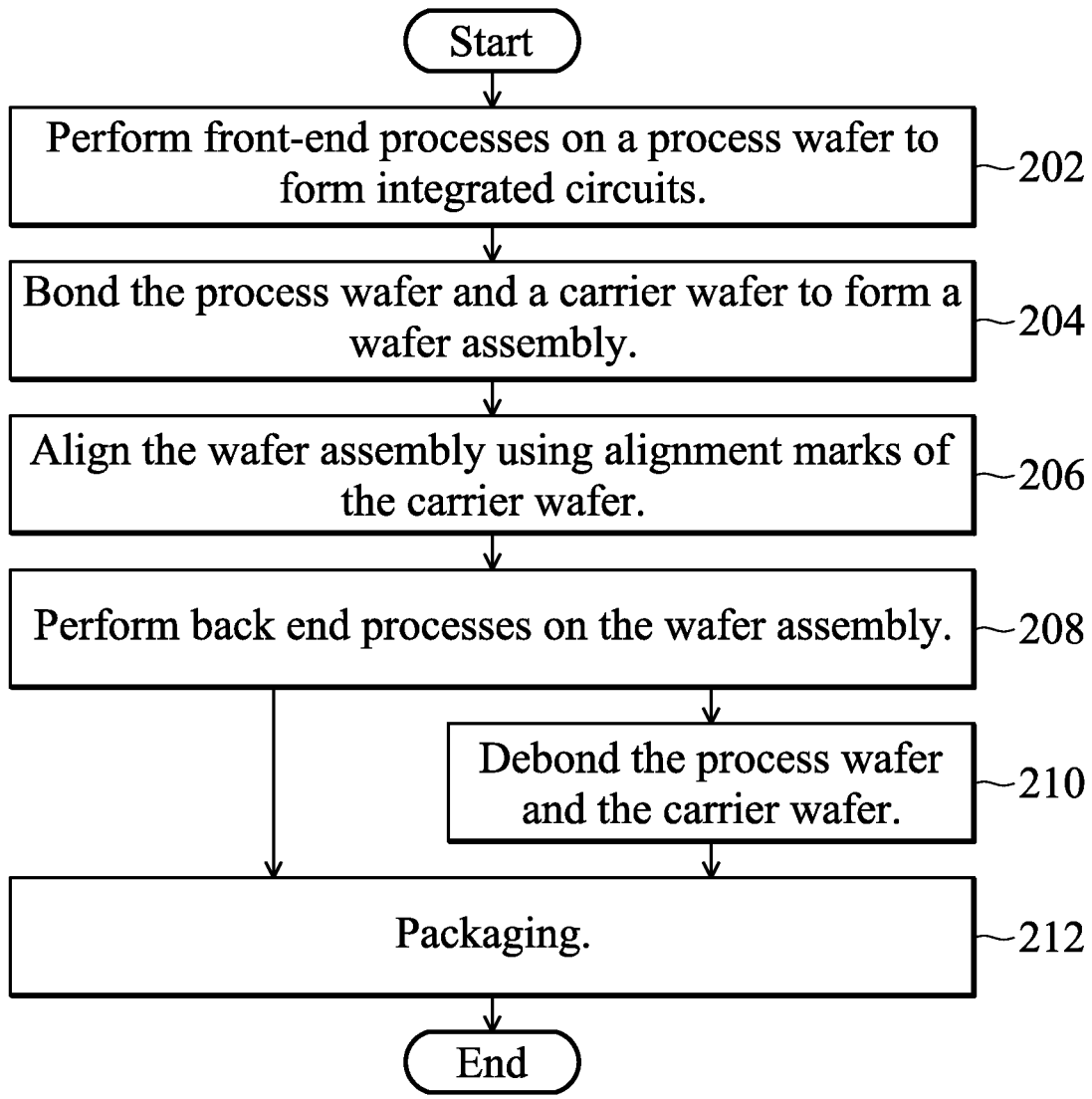
FIG. 2 is a flowchart of an exemplary method of fabricating integrated circuits using the exemplary wafer assembly in FIG. 1A according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary wafer assembly 100 with a process wafer 102 and a carrier wafer 104 according to some embodiments. The wafer assembly 100 includes the process wafer 102 and the carrier wafer 104 bonded together. A bonding layer 103 (e.g., a bonding adhesive layer or an epitaxial layer) bonds the process wafer 102 and the carrier wafer 104 in some embodiments. The carrier wafer 104 has at least one alignment mark 106 so that an alignment mark detector 108 (which is not part of the wafer assembly 100) can detect the alignment mark 106 for wafer alignment. The process wafer 102 and the carrier wafer 104 can comprise a suitable material, e.g., silicon. FIG. 1E is a schematic diagram of an exemplary wafer assembly 100 having a bonding layer 103 bonds the process wafer 102 and the carrier wafer 104.

The thickness of the process wafer 102 is less than 925 µm for a 450 mm wafer in some embodiments. The thickness of the carrier wafer 104 is greater than 2000 µm for a 450 mm wafer in some embodiments. The greater thickness of the carrier wafer 104 compared to that of the process wafer 102 can reduce sagging and warpage of the wafer assembly 100 resulting from bigger wafer size and/or a film deposition process.

The alignment mark 106 can be one or more notches formed on the carrier wafer 104 on a sidewall of the carrier wafer 104. In one example, three notches as alignment marks 106 are distributed at equal distance along the circumference of the carrier wafer 104 and the three notches have different sizes to distinguish each individual notch. With three notches as alignment marks 106 at equal distance, the wafer assembly 100 is rotated 120° to find at least one of the notches for alignment. In this example, the productivity is improved compared to a wafer assembly 100 having only one notch as alignment mark 106 that may need a 360° rotation for alignment. The alignment mark detector 108 includes a laser diode and a photo detector to locate the position of the alignment mark 106 in some embodiments.

FIG. 1B is a top view of the process wafer 102 of the wafer assembly in FIG. 1A according to some embodiments. The process wafer 102 has a thickness less than 925 µm in some embodiments. With the process wafer 102 having thinner thickness (as thin as about 100 µm in some examples), the wafer cost can be reduced. Also, there is no need for alignment mark 106 on the process wafer 102 for the wafer assembly 100 because the carrier wafer 104 has the alignment mark 106. With no alignment mark 106 formed on the process wafer 102, the die yield of the process wafer 104 can be improved by utilizing all available surface of the process wafer 104 without reserving any area for alignment mark 106.

FIG. 1C is a top view of the carrier wafer 104 of the wafer assembly in FIG. 1A according to some embodiments. The thickness of the carrier wafer 104 is greater than 2000 µm for a 450 mm wafer in some embodiments. Three notches 106a, 106b, and 106c are formed as alignment marks 106, distributed at equal distance along the circumference of the carrier wafer 104. The three notches have different sizes to distinguish among themselves.

The carrier wafers 104 having multiple notches can enhance wafer alignment productivity. For example, with three notches 106a, 106b, and 106c as alignment mark 106 at equal distance, the wafer assembly 100 is rotated 120° to find at least one of the notches for alignment. In this example, the productivity is improved compared to a wafer assembly 100 having only one notch that may need a 360° rotation for alignment.

The notches 106a, 106b, and 106c can have different shapes (e.g., circular), have different numbers (e.g., four notches instead of three or less than three), and can include multiple notches at one position (e.g., one notch at 0°, two notches at 120°, three notches at 240°) in other embodiments. Also, different alignment marks 106 (e.g., dots or depressions on the side or the bottom of the carrier wafer 104) can be used instead of notches 106a, 106b, and 106c in other embodiments. In at least one embodiment, one or more of the notches 106a, 106b, and 106c or the alignment marks 106 are omitted.

In some embodiments, the carrier wafer 104 can be detached from the process wafer 102 in FIG. 1A and reused. The carrier wafer 104 detached from the process wafer 102 can be recycled after chemical mechanical planarization (CMP) polishing, for example.

FIG. 1E is a schematic diagram of an exemplary wafer assembly 100 with a process wafer 102 and a carrier wafer 104 according to some embodiments. The wafer assembly includes the process wafer 102 and the carrier wafer 104 bonded together. A bonding layer 103 (e.g., a bonding adhesive layer or an epitaxial layer) bonds the process wafer 102 and the carrier wafer 104 in some embodiments. The carrier wafer 104 has at least one alignment mark 106 so that an alignment mark detector 108 (which is not part of the wafer assembly 100) can detect the alignment mark 106 for wafer alignment. The process wafer 102 and the carrier wafer 104 can comprise any suitable material, e.g., silicon.

FIG. 1D is a top view of the carrier wafer 104 of the wafer assembly in FIG. 1A or FIG. 1E according to some embodiments. The thickness of the carrier wafer 104 is greater than 2000 μm for a 450 mm wafer in some embodiments. Three notches 106e, 106f, and 106g are formed as alignment marks 106, distributed along the circumference of the carrier wafer 104. In some embodiments, at least one alignment mark includes the a first alignment mark 106f having a first shape and a second alignment mark 106g having a second shape different from the first shape. In some embodiments, the first alignment mark has a first size that is different than a second size of the second alignment mark.

FIG. 2 is a flowchart of an exemplary method of fabricating integrated circuits using the exemplary wafer assembly 100 in FIG. 1A according to some embodiments. At step 202, front-end processes are performed on the process wafer 102 to form integrated circuits. The front-end processes can include forming shallow trench isolation (STI), forming wells, forming devices (e.g., transistors, capacitors, or resistors), forming interconnections, and/or any other suitable processes in some embodiments. The front-end processes can be performed by any suitable methods or processes known in the art.

At step 204, the process wafer 102 and the carrier wafer 104 are bonded to form the wafer assembly 100. In some embodiments, the process wafer 102 and the carrier wafer 104 are bonded together by using bonding materials in a bonding adhesive layer 103 between the process wafer 102 and the carrier wafer 104. The bonding materials can comprise any suitable materials known in the art. For example, commercially available WAFERBOND® HT-series temporary bonding materials designed to provide the necessary mechanical support during further processing (e.g., thinning, TSV process, etc.) at various temperatures.

In some other embodiments, the process wafer 102 and the carrier wafer 104 are bonded by growing an epitaxial layer 103 (e.g., Si epitaxy, or silicon epi layer) between the process wafer 102 and the carrier wafer 104 and annealing. For example, the silicon epi layer can be grown below the process wafer 102. The silicon epi layer is formed by performing a chemical vapor deposition (CVD) process for depositing thin films of single-crystal silicon in some embodiments. The wafer assembly 100 with the silicon epi layer 103 between the process wafer 102 and the carrier wafer 104 is then annealed at temperatures 300° C.-500° C. to bond the process wafer 102 and the carrier wafer 104 in some embodiments.

At step 206, the wafer assembly 100 is aligned using the alignment mark 106 (e.g., notches 106a, 106b, and 106c in FIG. 1C) on the carrier wafer 104. The alignment can be performed by using the alignment mark detector 108 that includes a laser diode and a photo detector to locate the position of the alignment mark 106 in some embodiments.

At step 208, back-end processes are performed on the wafer assembly 100. The back-end processes can include wafer testing, wafer back-grinding, die separation, and/or die tests, among others. The back-end processes can be performed by any suitable processes known in the art.

At step 212, the wafer assembly 100 goes through further back-end process such as packaging in some embodiments. In some other embodiments, the carrier wafer 104 is debonded (or detached) from the process wafer 102 at step 210 prior to step 212. The carrier wafer 104 can be reused. For debonding (or detaching) the carrier wafer 104 from the process wafer 102, the wafer assembly 100 is fixed in an appropriate debond-module on both sides with a compliant chucking system (e.g., vacuum chucks), then uniformly heated (e.g., 300° C.-400° C.) to a debonding temperature. When the debonding temperature is reached, the process wafer 102 and the carrier wafer 104 are slid apart. The process wafer 102 is fully supported on the whole area and kept stress-free during the debonding process.

For wafer assembly 100 using bonding materials (adhesive), the debond temperature can be 200° C. or lower, depending on the bonding materials in some embodiments. After separation of the wafers, the process wafer 102 is cleaned in a single wafer-cleaning chamber, where the remaining bonding material (adhesive) is removed with an appropriate solvent in some embodiments.

According to some embodiments, a wafer assembly includes a process wafer and a carrier wafer. Integrated circuits are formed on the process wafer. The carrier wafer is bonded to the process wafer. The carrier wafer has at least one alignment mark.

According to some embodiments, a method includes bonding a process wafer having integrated circuits and a carrier wafer having at least one alignment mark to form a wafer assembly. The wafer assembly is aligned using the at least one alignment mark of the carrier wafer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A wafer assembly, comprising:
   a process wafer, wherein integrated circuits are formed on the process wafer; and
   a carrier wafer bonded to the process wafer, the carrier wafer has at least one alignment mark on a first surface of the carrier wafer, wherein the first surface is attached to the process wafer, and wherein the carrier wafer has a thickness greater than 2000 μm.

2. The wafer assembly of claim 1, further comprising a bonding adhesive layer that bonds the process wafer and the carrier wafer.

3. The wafer assembly of claim 1, further comprising an epi layer that bonds the process wafer and the carrier wafer.

4. The wafer assembly of claim 3, wherein the epi layer has a thickness ranging from 100 angstrom to 1000 angstrom.

5. The wafer assembly of claim 1, wherein the process wafer has no alignment mark.

6. The wafer assembly of claim 1, wherein the carrier wafer has multiple alignment marks distributed at equal distance along the circumference of the carrier wafer.

7. The wafer assembly of claim 6, wherein the multiple alignment marks have different sizes.

8. The wafer assembly of claim 1, wherein a first thickness of the process wafer is less than a second thickness of the carrier wafer.

9. A wafer assembly, comprising:
   a process wafer having a first thickness and no alignment mark, wherein integrated circuits are formed on the process wafer; and
   a carrier wafer having a second thickness and bonded to the process wafer,
   wherein the carrier wafer has multiple alignment marks distributed at equal distance along the circumference of the carrier wafer and the first thickness is less than the second thickness, and wherein the carrier wafer has a thickness greater than 2000 μm.

10. The wafer assembly of claim 9, further comprising a bonding adhesive layer that bonds the process wafer and the carrier wafer.

11. The wafer assembly of claim 9, further comprising an epi layer that bonds the process wafer and the carrier wafer, wherein the epi layer has a third thickness ranging from 100 angstrom to 1000 angstrom.

12. A wafer assembly comprising:
   a process wafer having a first thickness, wherein active circuitry is on the process wafer;
   a carrier wafer having a second thickness and at least one alignment mark, the alignment mark on a first surface of the carrier wafer, wherein the first surface is attached to the process wafer; and
   a bonding layer configured to bond the process wafer to the carrier wafer, wherein the carrier wafer has a thickness greater than 2000 μm.

13. The wafer assembly of claim 12, wherein the at least one alignment mark is in a bottom surface of the carrier wafer opposite from the process wafer.

14. The wafer assembly of claim 12, wherein the at least one alignment mark includes a plurality of marks spaced from each other across the carrier wafer.

15. The wafer assembly of claim 12, wherein the bonding layer has a debonding temperature equal to or less than 200° C.

16. The wafer assembly of claim 12, wherein the bonding layer comprises an epi layer having a thickness ranging from 100 angstroms to 1000 angstroms.

17. The wafer assembly of claim 12, wherein the at least one alignment mark is in a sidewall of the carrier wafer.

18. The wafer assembly of claim 12, wherein the at least one alignment mark includes a first alignment mark having a first shape and a second alignment mark having a second shape different from the first shape.

19. The wafer assembly of claim 12, wherein the at least one alignment mark includes a first alignment mark having a first size and a second alignment mark having a second size different from the first size.

20. The wafer assembly of claim 12, wherein the at least one alignment mark includes a first alignment mark, a second alignment mark and a third alignment mark, and a spacing between the first alignment mark and the second alignment mark is different from a spacing between the first alignment mark and the third alignment mark.

* * * * *